(12) United States Patent
Huynh

(10) Patent No.: US 8,681,030 B1
(45) Date of Patent: Mar. 25, 2014

(54) RESONATOR SCHEMES IN RF CONTINUOUS-TIME BANDPASS DELTA-SIGMA MODULATORS

(71) Applicant: Phuong Thu-Minh Huynh, Fairfax, VA (US)

(72) Inventor: Phuong Thu-Minh Huynh, Fairfax, VA (US)

(73) Assignee: Phuong Huynh, Fairfax, VA (US)

( * ) Notice: Subject to any disclaimer, the term of this patent is extended or adjusted under 35 U.S.C. 154(b) by 0 days.

(21) Appl. No.: 13/709,038

(22) Filed: Dec. 9, 2012

(51) Int. Cl.
*H03M 3/02* (2006.01)
*H01L 23/48* (2006.01)
*H03H 7/12* (2006.01)
*H03M 3/00* (2006.01)
*H01L 23/522* (2006.01)
*H01L 23/64* (2006.01)
*H01L 49/02* (2006.01)
*H03H 7/01* (2006.01)

(52) U.S. Cl.
CPC ........... *H03M 3/408* (2013.01); *H01L 23/5227* (2013.01); *H01L 23/645* (2013.01); *H01L 28/10* (2013.01); *H03H 7/0115* (2013.01)
USPC ............ 341/143; 257/531; 333/175; 333/219

(58) Field of Classification Search
CPC ....................................... H03M 3/408
USPC .......... 341/143; 333/175, 185, 202, 204, 219; 257/531
See application file for complete search history.

(56) References Cited

U.S. PATENT DOCUMENTS

| | | | | |
|---|---|---|---|---|
| 5,760,456 A | * | 6/1998 | Grzegorek et al. | ........... 257/531 |
| 7,034,728 B2 | * | 4/2006 | Luh et al. | ....................... 341/143 |
| 7,057,541 B1 | * | 6/2006 | Kaplan | ......................... 341/143 |
| 7,253,759 B1 | * | 8/2007 | Kaplan | ......................... 341/143 |
| 8,374,566 B2 | * | 2/2013 | Gao et al. | ...................... 333/175 |
| 2011/0148679 A1 | * | 6/2011 | Karthaus et al. | .............. 341/143 |

* cited by examiner

Primary Examiner — Howard Williams (57) ABSTRACT

Apparatuses for composing LC resonators in a continuous-time RF bandpass delta-sigma modulator are provided. A plurality of resonator inductors are shaped and strategically positioned on an integrated circuit die to minimize the resonant couplings. The resonator inductors can be also constructed from pairs of bond wires connected to a ground paddle, or to a set of lead frame pins. The inductance in each resonator can be increased by appending a specifically shaped planer inductor constructed from the PCB metal track to the bond wire pair via two lead frame pins.

18 Claims, 5 Drawing Sheets

RESONATOR SCHEMES IN RF CONTINUOUS-TIME BANDPASS DELTA-SIGMA MODULATORS

FIELD OF THE INVENTION

The present invention relates in general to construction of inductors in LC resonators used in RF continuous-time bandpass delta-sigma modulators. Inductors are formed from metal layers on an integrated circuit die, or bond wire inductance combined with external planar inductors constructed from metal tracks on the PCB board.

BACKGROUND OF THE INVENTION

A delta-sigma modulator or sigma-delta modulator is a feedback system that employs simple circuit blocks to achieve high-resolution quantized output signals. The delta-sigma modulator is widely adapted to electronics circuits such as analog-to-digital converters (A/D), digital-to-analog converters (D/A) or frequency synthesizers, and is highly attractive in wireless communications due to its simplicity and low-power consumption. The radio-frequency (RF) bandpass delta-sigma modulator is one type of delta-sigma modulator that is well adaptable to RF signal reception and subsequent digitization without frequency down conversion.

SUMMARY OF THE INVENTION

This invention features an integrated circuit device for digitizing an RF signal comprising: an integrated circuit die having a rectangular shape; a plurality of LC resonators constituting a bandpass filter configured to receive the error signal and a first digital-to-analog signal to produce an amplified error signal; a summer receiving an RF signal and a second digital-to-analog signal to produce an error signal; a analog-to-digital converter configured to receive the amplified error signal to produce a quantized RF signal; a digital-to-analog converter configured to receive the quantized RF signal to generate a first digital-to-analog signal and a second digital-to-analog signal; wherein there are at least two LC resonators and at most four LC resonators; each LC resonator comprises a U-shaped inductor, constructed from a conductive metal layer on the integrated circuit die; a first and second U-shaped inductors are aligned along a horizontal axis centered approximately on the integrated circuit die, with the rounded tip of the first U-shaped inductor facing outward to the first edge of the integrated die, and the rounded tip of the second U-shaped inductor facing outward to the second edge of the integrated die, which is opposite to the first edge of the integrated die; the centers of the rounded tips of the first and second U-shaped inductors are electrically connected to a constant potential; a first capacitor is coupled across the gaps at the two ends of the first U-shaped inductor; and a second capacitors is coupled across the gaps at the two ends of the second U-shaped inductor.

When there are three LC resonators, a third U-shaped inductor is aligned along a vertical axis perpendicular to the horizontal axis and centered approximately on the integrated circuit die, with the rounded tip of the third U-shaped inductor facing outward to the third edge of the integrated die; the center of the rounded tip of the third U-shaped inductor is electrically connected to a constant potential; and a third capacitor is coupled across the gap at the two ends of the third U-shaped inductor.

When there are four LC resonators, a third and fourth U-shaped inductors are aligned along a vertical axis perpendicular to the horizontal axis and centered approximately on the integrated circuit die, with the rounded tip of the third U-shaped inductor facing outward to the third edge of the integrated die, and the rounded tip of the fourth U-shaped inductor facing outward to the fourth edge of the integrated die, which is opposite to the third edge of the integrated die; the centers of the rounded tips of the third and fourth U-shaped inductors are electrically connected to a constant potential; a third capacitor is coupled across the gaps at the two ends of the third U-shaped inductor; and a fourth capacitor is coupled across the gaps at the two ends of the fourth U-shaped inductor.

The invention also features an integrated circuit device for digitizing an RF signal comprising: a lead frame comprising a plurality of peripherally positioned pins; a die-attach paddle positioned within a ring formed by the plurality of peripherally positioned pins; an integrated circuit die having a rectangular shape attached to the center of die-attach paddle; a plurality of LC resonators constituting a bandpass filter configured to receive the error signal and a first digital-to-analog signal to produce an amplified error signal; a summer receiving an input RF signal and a second digital-to-analog signal to produce an error signal; a analog-to-digital converter configured to receive the amplified error signal to produce a quantized RF signal; a digital-to-analog converter configured to receive the quantized RF signal to generate a first digital-to-analog signal and a second digital-to-analog signal; wherein there are at least two LC resonators and at most four LC resonators; the integrated die comprises a plurality of peripherally positioned pads; the inductor in each LC resonator is formed by two bond wires, with the first end of the first bond wire attached to a first pad on the integrated die, the first end of the second bond wire attached to a second pad on the integrated die adjacent to the first pad; a first and second bond-wire inductors are aligned along a horizontal axis centered approximately on the integrated circuit die, with the first and second pads of the first bond-wire inductor mirroring each other along the horizontal axis, and the first and second pads of the second bond-wire inductor mirroring each other along the horizontal axis; a first capacitor is coupled across the first and second pads connected to the first bond-wire inductor; and a second capacitor is coupled across the first and second pads connected to the second bond-wire inductor.

When there are three LC resonators, a third bond-wire inductor is aligned along a vertical axis perpendicular to the horizontal axis and centered approximately on the integrated circuit die, with the first and second pads of the third bond-wire inductor mirroring each other along the vertical axis; and a third capacitor is coupled across the first and second pads connected to the third bond-wire inductor.

When there are four LC resonators, a third and fourth bond-wire inductors are aligned along a vertical axis perpendicular to the horizontal axis and centered approximately on the integrated circuit die, with the first and second pads of the third bond-wire inductor mirroring each other along the vertical axis, and the first and second pads of the fourth bond-wire inductor mirroring each other along the vertical axis; a third capacitor is coupled across the first and second pads connected to the third bond-wire inductor; and a fourth capacitor is coupled across the first and second pads connected to the fourth bond-wire inductor.

Furthermore, the second ends of the two bond wires forming the inductor of the first LC resonator are attached to a first common pin, which is approximately a center pin on the first side of the lead frame; wherein the first common pin is electrically connected to a constant potential; the second ends of the two bond wires forming the inductor of the second LC resonator are attached to a second common pin, which is approximately a center pin on the second side of the lead frame; and the second common pin is electrically connected to a constant potential.

For a three-LC-resonator configuration, the second ends of the two bond wires forming the inductor of the third LC resonator are attached to a third common pin, which is approximately a center pin on the third side of the lead frame; wherein the third common pin is electrically connected to a constant potential.

For a four-LC-resonator configuration, the second ends of the two bond wires forming the inductor of the third LC resonator are attached to a third common pin, which is approximately a center pin on the third side of the lead frame; wherein the third common pin is electrically connected to a constant potential; the second ends two bond wires forming the inductor of the fourth LC resonator are attached to a fourth common pin, which is approximately a center pin on the fourth side of the lead frame; and the fourth common pin is electrically connected to a constant potential.

As an alternative, the second ends of the two bond wires forming the inductor of the first LC resonator are attached outward from the integrated circuit die to the die-attach paddle near the horizontal axis; wherein the second ends of the two bond wires forming the inductor of the second LC resonator are attached outward from the integrated circuit die to the die-attach paddle near the horizontal axis.

For a three-LC-resonator configuration, the second ends of the two bond wires forming the inductor of the third LC resonator are attached outward from the integrated circuit die to the die-attach paddle near the vertical axis.

For a four-LC-resonator configuration, the second ends of the two bond wires forming the inductor of the third LC resonator are attached outward from the integrated circuit die to the die-attach paddle near the vertical axis; wherein the second ends of the two bond wires forming the inductor of the fourth LC resonator are attached outward from the integrated circuit die to the die-attach paddle near the vertical axis.

The invention also features an integrated circuit device digitizing an RF signal comprising: a PCB board; a lead frame comprising a plurality of peripherally positioned pins attached to the PCB board; a die-attach paddle positioned within a ring formed by the plurality of peripherally positioned pins; an integrated circuit die having a rectangular shape attached to the die-attach paddle; a plurality of LC resonators constituting a bandpass filter configured to receive the error signal and a first digital-to-analog signal to produce an amplified error signal; a summer receiving an input RF signal and a second digital-to-analog signal to produce an error signal; an analog-to-digital converter configured to receive the amplified error signal to produce a quantized RF signal; a digital-to-analog converter configured to receive the quantized RF signal to generate a first digital-to-analog signal and a second digital-to-analog signal; wherein there are at least two LC resonators and at most four LC resonators; the integrated die comprises a plurality of peripherally positioned pads; the inductor in each LC resonator is partially formed by a pair of bond wires, with the first end of the first bond wire attached to a first pad on the integrated die, the first end of the second bond wire attached to a second pad on the integrated die adjacent to the first pad; a first and second pairs of bond wires, belonging to the first and second LC resonators, respectively, are aligned along a horizontal axis centered approximately on the integrated circuit die, with the first and second pads to the first pair of bond wires mirroring each other along the horizontal axis, and the first and second pads to the second pair of bond wires mirroring each other along the horizontal axis; a first capacitor is coupled across the first and second pads connected to the first pair of bond wires; and a second capacitor is coupled across the first and second pads connected to the second pair of bond wires.

When there are three LC resonators, a third pair of bond wires, belonging third LC resonator is aligned along a vertical axis perpendicular to the horizontal axis and centered approximately on the integrated circuit die, with the first and second pads to the third pair of bond wires mirroring each other along the vertical axis; wherein a third capacitor is coupled across the first and second pads connected to the third pair of bond wires.

When there are four LC resonators, a third and fourth pairs of bond wires, belonging respectively to the third and fourth LC resonators, are aligned along a vertical axis perpendicular to the horizontal axis and centered approximately on the integrated circuit die, with the first and second pads to the third pair of bond wires mirroring each other along the vertical axis, and the first and second pads to the fourth pair of bond wires mirroring each other along the vertical axis; wherein a third capacitor is coupled across the first and second pads connected to the third pair of bond wires; and a fourth capacitor is coupled across the first and second pads connected to the fourth pair of bond wires.

Furthermore, the second end of the first bond wire of the first LC resonator is attached to a first pin on the lead frame, and the second end of the second bond wire of the first LC resonator is attached to a second pin on the lead frame; wherein the first and second pins are adjacent to each other, and are approximately centered along the first side of the lead frame; a first U-shaped conductive track on the PCB board having the two ends connected to the first and second pins on the lead frame with the first pair of bond wires forms the complete inductor of the first LC resonator; the center of the rounded tip of the first U-shaped conductive track is electrically connected to a constant potential; the second end of the first bond wire of the second LC resonator is attached to a third pin on the lead frame, and the second end of the second bond wire of the second LC resonator is attached to a fourth pin on the lead frame; the third and fourth pins are adjacent to each other, and are approximately centered along the second side of the lead frame; a second U-shaped conductive track on the PCB board having the two ends connected to the third and fourth pins on the lead frame with the second pair of bond wires forms the complete inductor of the second LC resonator; the center of the rounded tip of the second U-shaped conductive track is electrically connected to a constant potential.

In a three-LC-resonator configuration, the second end of the first bond wire of the third LC resonator is attached to a fifth pin on the lead frame, and the second end of the second bond wire of the third LC resonator is attached to a sixth pin on the lead frame; wherein the fifth and sixth pins are adjacent to each other, and are approximately centered along the third side of the lead frame; a third U-shaped conductive track on the PCB board having the two ends connected to the fifth and sixth pins on the lead frame with the third pair of bond wires forms the complete inductor of the third LC resonator; and the center of the rounded tip of the third U-shaped conductive track is electrically connected to a constant potential.

In a four-LC-resonator configuration, the second end of the first bond wire of the third LC resonator is attached to a fifth pin on the lead frame, and the second end of the second bond wire of the third LC resonator is attached to a sixth pin on the lead frame; wherein the fifth and sixth pins are adjacent to each other, and are approximately centered along the third side of the lead frame; a third U-shaped conductive track on the PCB board having the two ends connected to the fifth and sixth pins on the lead frame with the third pair of bond wires forms the complete inductor of the third LC resonator; the center of the rounded tip of the third U-shaped conductive track is electrically connected to a constant potential; the second end of the first bond wire of the fourth LC resonator is attached to a seventh pin on the lead frame, and the second end of the second bond wire of the fourth LC resonator is attached to a eighth pin on the lead frame; the seventh and eighth pins are adjacent to each other, and are approximately centered along the fourth side of the lead frame; a fourth U-shaped conductive track on the PCB board having the two ends connected to the seventh and eighth pins on the lead frame with the fourth pair of bond wires forms the complete inductor of the fourth LC resonator; and the center of the rounded tip of the fourth U-shaped conductive track is electrically connected to a constant potential.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

In overview, the present disclosure concerns electronic devices or units, some of which are referred to as communication units, such as cellular phone or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

It is also understood that the embodiments of a device or article described herein can be manufactured, used, or shipped in a number of positions and orientations. The terms "die" generally refer to the physical object that is the basic workpiece that is transformed by various process operations into the desired integrated circuit (IC) device. A die is usually singulated from a wafer, and wafers may be made of semiconducting, non semiconducting, or combinations of semiconducting and non-semiconducting materials. A board is typically a resin-impregnated fiberglass structure that acts as a mounting substrate for the die. A board can be prepared with a bond pad, also referred to as a bond finger, that is flush with the board, or the bond pad can be set upon the board surface. As depicted in this disclosure, a bond pad is not limited to being flush or being set upon the surface only because it is illustrated as such, unless it is explicitly stated in the text.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Figure 1:
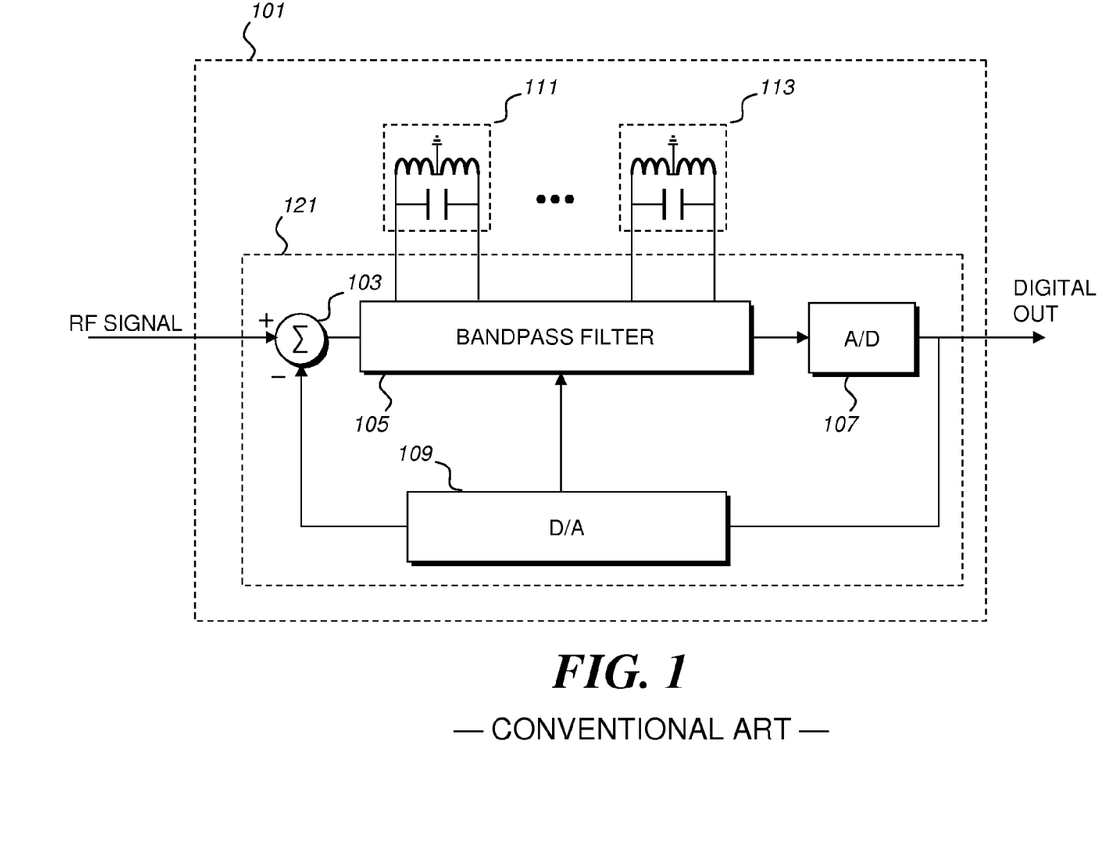
FIG. 1 is a schematic diagram illustrating a conventional continuous-time bandpass delta-sigma modulator.

Referring now to FIG. 1, a schematic diagram 101 illustrating a conventional continuous-time bandpass delta-sigma modulator for RF applications. The modulator comprises a summer 103, an analog-to-digital (A/D) converter 107, a digital-to-analog (D/A) converter 109, a plurality of LC resonators 111 and 113, which are part of the bandpass filter 105. The bandpass delta-sigma core 121 comprises the summer 103, bandpass filter 105, A/D 107 and D/A 109; and is used for reference purpose in later exemplary embodiments.

In the delta-sigma modulator 101, the summer 103 subtracts the analog format of the digital output, which is converted by the D/A 109, from the input RF signal to generate an error signal. The bandpass filter 105 receives, amplifies, and bandpass filters the error signal; and also receives a second feedback signal from the D/A 109 to produce an amplified error signal. The A/D 107 over-samples and quantizes the amplified error signal and produces a high-resolution digital output format which is equivalent to the input RF signal.

In typical RF applications wherein the input RF signal frequency is in the gigahertz range, the bandpass filter 105 center frequency must match the input RF signal frequency, in order for the modulator to function properly. Since the RF signal bandwidth is only a few or tens of megahertz, the bandpass filter 105 passband must encompass but not to largely exceed the RF signal bandwidth. Therefore, it is expected that the passband of the bandpass filter 105 is on the order of tens of megahertz.

Designing such narrow-band bandpass filter in the RF frequencies is a challenging task because due to the feedback property of the delta-sigma modulator 101, the bandpass filter 105 must meet the phase shift requirement for the delta-sigma modulator to stabilize. In current state-of-the-art technologies, the bandpass filter 105 is generally constructed from a plurality of LC resonators 111 and 113, which comprise an inductor, L, and a capacitor, C. If the resonant frequencies need to be tuned, then a varactor is used instead of the capacitor. To achieve the highest noise rejection from the power supply, a differential inductor is usually used with its center tap connected to a virtual ground, or a constant potential, as shown in the LC resonators 111 and 113. Furthermore, to achieve high gain, each LC resonator must have quality factor (Q-factor) above 100. The bandpass filter 105 pass band is then constructed from positioning the resonant frequencies of the LC resonators 111 and 113 in a cluster centering about the input RF signal frequency.

The order of a bandpass delta-sigma modulator relates to the number of L and C components in the bandpass filter 105. For example, a second-order bandpass delta-sigma modulator comprises one LC resonator, or one L and one C; whereas an eighth-order modulator comprises four LC resonators. High-order bandpass delta-sigma modulators are characterized by excessive phase shifts in the bandpass filter; and therefore, are difficult to stabilize due to their feedback characteristic. Nevertheless, fourth-order to eighth-order modulators can be stabilized easily and are adequate to achieve high-resolution A/D quantization to meet various current wireless standard requirements.

Since the bandpass filter 105 pass band is constructed from positioning the resonant frequencies of the LC resonators 111 and 113 in a cluster centering about the input RF signal frequency, the frequency spacing between resonant frequencies of the LC resonators are only a few or tens of megahertz apart. Experimental data have shown that the high gains and high Q-factors of the LC resonators often result in an effect known as "resonance pulling and pushing" due to the magnetic couplings among the inductors as they are physically placed close to each other on the integrated circuit die. The pulling and pushing effects can be seen as additional undesirable coupling paths between the resonators, which distort the feedback property and cause the bandpass delta-sigma modulator to become unstable and inoperable.

The present disclosure addresses the resonance coupling issue and focuses on the design and positioning of the inductors in the LC resonators to minimize the coupling effect. The ultimate way of minimizing the coupling effect is to physically place the resonators far apart from each other as the magnetic field strength decreases with increased distance of separation. However, monolithic integration to reduce the system size and cost prohibits such approach.

Figure 2:
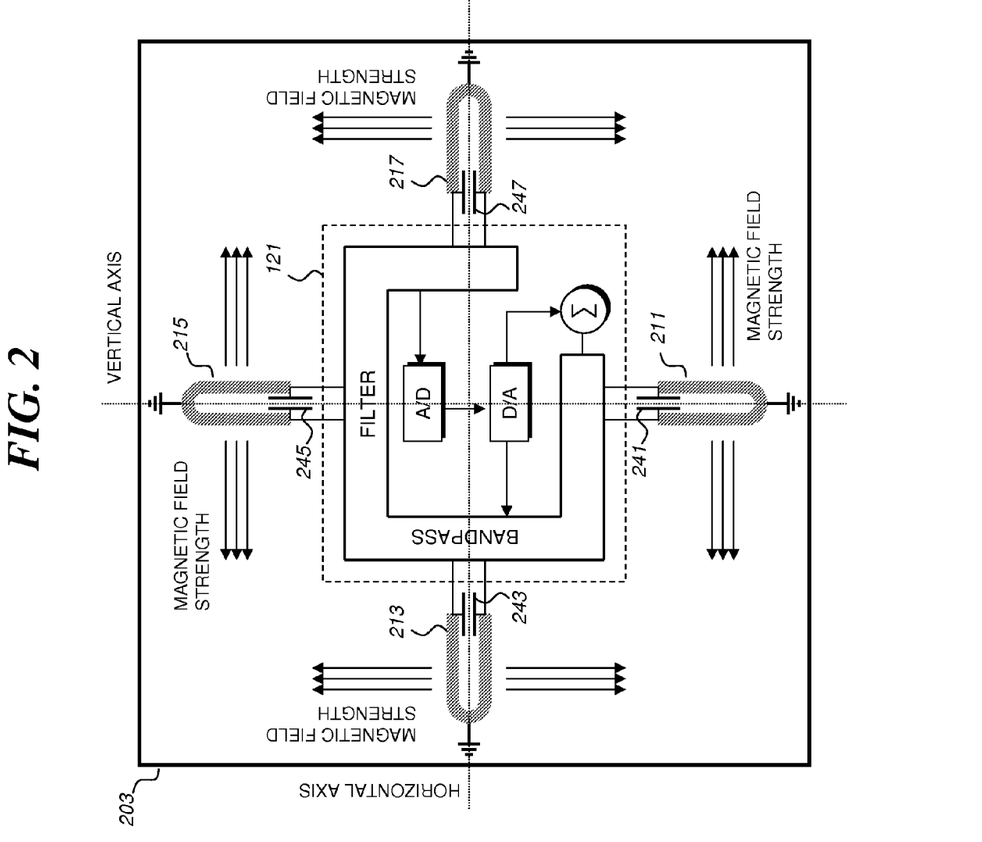
FIG. 2 is a top view of an integrated circuit die illustrating an exemplary resonator scheme for a continuous-time bandpass delta-sigma modulator according to disclosed embodiments.

Referring now to FIG. 2, the top view of an integrated circuit die 203 illustrating an exemplary resonator scheme for the RF bandpass delta-sigma modulator in accordance with one or more embodiments will be discussed and described. The integrated circuit die 203 is an eighth-order bandpass delta-sigma modulator comprising four resonators with four long U-shaped differential inductors 211, 213, 215 and 217 and the bandpass delta-sigma core 121. Four capacitors 241, 243, 245, and 247 are connected across at the U tops of the inductors 211, 213, 215 and 217, respectively, forming four LC resonators. The rounded tips of the U-shaped inductors are electrically connected to a constant potential. The inductors 213 and 217 are aligned on a horizontal axis with their rounded tips facing outward on the integrated circuit die. Likewise, the inductors 211 and 215 are aligned on a vertical axis, perpendicular to the horizontal axis, with their rounded tips facing outward on the integrated circuit die.

Electromagnetic simulations have shown the least coupling, about −75 dB at 2 GHz, between opposite inductors, such as the inductor pairs (211, 215) and (213, 217). Since the magnetic field strength is mostly distributed vertically along the two shafts of the U and only a small portion near the rounded tip, it is evident from the integrated circuit top view 203 that very little couplings are found between these pairs. The simulations have also shown increase in magnetic coupling of about 10 dB between pairs of inductors that are oriented 90 degree apart, such as pairs (211, 213), (211, 217), (213, 215), and (215, 217). It is seen that the inductors are physically closer in the pairs, resulting in higher couplings, as opposed to inductor pairs that have opposite inductors.

It is also understood from the above exemplary embodiments that a lower order bandpass delta-sigma modulator, such as a sixth-order modulator that comprises three resonators, or a fourth-order modulator that comprises two resonators, can be also realized as in the integrated circuit die 203 to minimize the magnetic field coupling between pair of inductors. A sixth-order modulator would have three resonators; therefore, two inductors can be aligned on a first axis while the other inductor is placed on a second axis perpendicular to the first axis. Likewise, a fourth-order modulator would have two resonators having their two inductors aligned on one axis.

Figure 3:
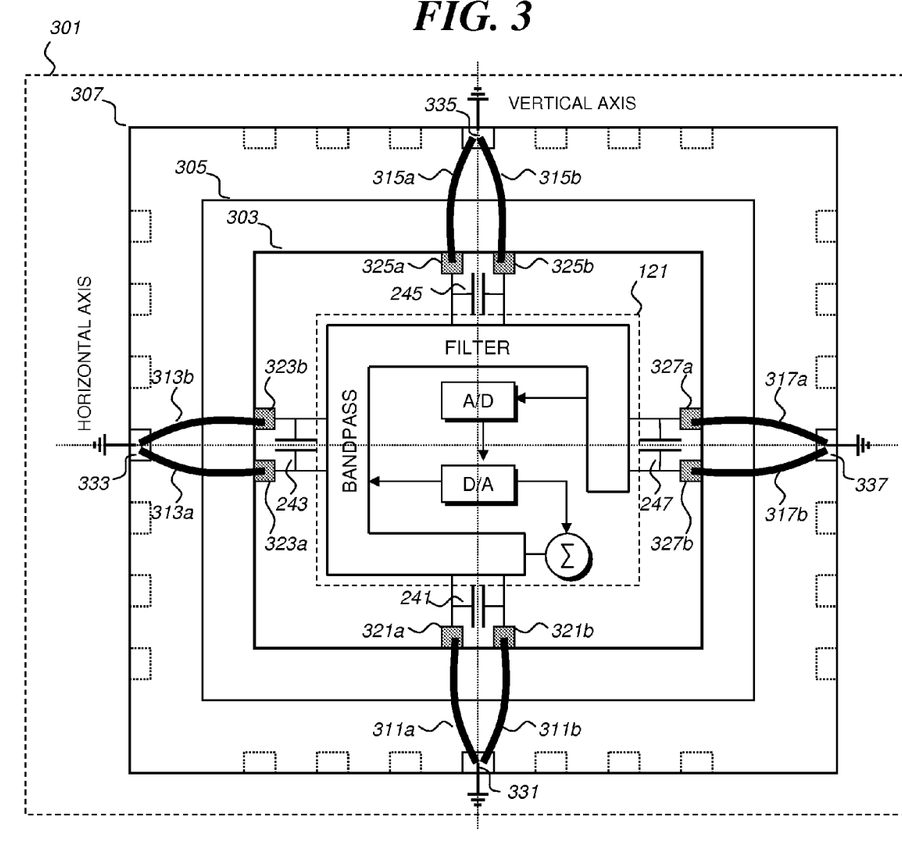
FIG. 3 is a top view of an integrated circuit package illustrating an alternative exemplary resonator scheme for a continuous-time bandpass delta-sigma modulator according to disclosed embodiments.

Referring now to FIG. 3, the top view of a quad flat package 301 illustrating an alternative exemplary resonator scheme for an eighth-order bandpass delta-sigma modulator in accordance with one or more embodiments will be discussed and described. The alternative embodiments provide and alternative approach to construct inductors using bond wires. It should be understood herein that the term "quad flat package" encompasses packages with leads, often referred to as "QFP", and also packages with no leads, often referred to as "QFN". The quad flat package 301 comprises a lead frame 307 with a plurality of peripherally positioned pins, a die-attach paddle 305, and an integrated circuit die 303. The die-attach paddle 305 is positioned within a ring formed by the peripheral pins. The die 303 is attached to the center of the die-attach paddle 305 and comprises a bandpass delta-sigma core 121.

Four pairs of bond wires (311a, 311b), (313a, 313b), (315a, 315b) and (317a, 317b) provide connections from the die 303 to the lead frame 307. More specifically, the pair (311a, 311b) connects to the die pads 321a and 321b, respectively, on one end, while the other ends of the pair are connected to the same lead frame pin 331. Likewise, pair (313a, 313b) connects to the die pads 323a, 323b and to the lead frame pin 333; pair (315a, 315b) connects to the die pads 325a, 325b and to the lead frame pin 335; and pair (317a, 317b) connects to the die pad 327a, 327b and to the lead frame pin 337. Each pair of bond wires having an amount of inductance proportional to the bond wire length forms a differential inductor. The bond wire pair (311a, 311b) with a capacitor 241 connected across the die pads 321a and 321b forms a first resonator. The center tap of the differential inductor (311a, 311b) is tied to the lead frame pin 331, which can be electrically connected to a constant potential. Likewise, the bond wire pair (315a, 315b) with a capacitor 245 connected across the die pads 325a and 325b form a second resonator; the bond wire pair (313a, 313b) with a capacitor 243 connected across the die pads 323a and 323b form a third resonator; and the bond wire pair (317a, 317b) with a capacitor 247 connected across the die pads 327a and 327b form a fourth resonator.

To minimize the magnetic coupling effect as discussed in the previous disclosed embodiments, the bond wire inductors (313a, 313b) and (317a, 317b) are aligned on a horizontal axis, while the bond wire inductors (311a, 311b) and (315a, 315b) are aligned on a vertical axis, perpendicular to the horizontal axis. The increase in physical separation between the inductors can help minimizing the coupling further. It is also understood that a fourth-order or sixth-order bandpass delta-sigma modulator can also be configured with the above inductor positioning scheme using only two resonators, or three resonators respectively; and minimal magnetic couplings between inductors can still be achieved.

Figure 4:
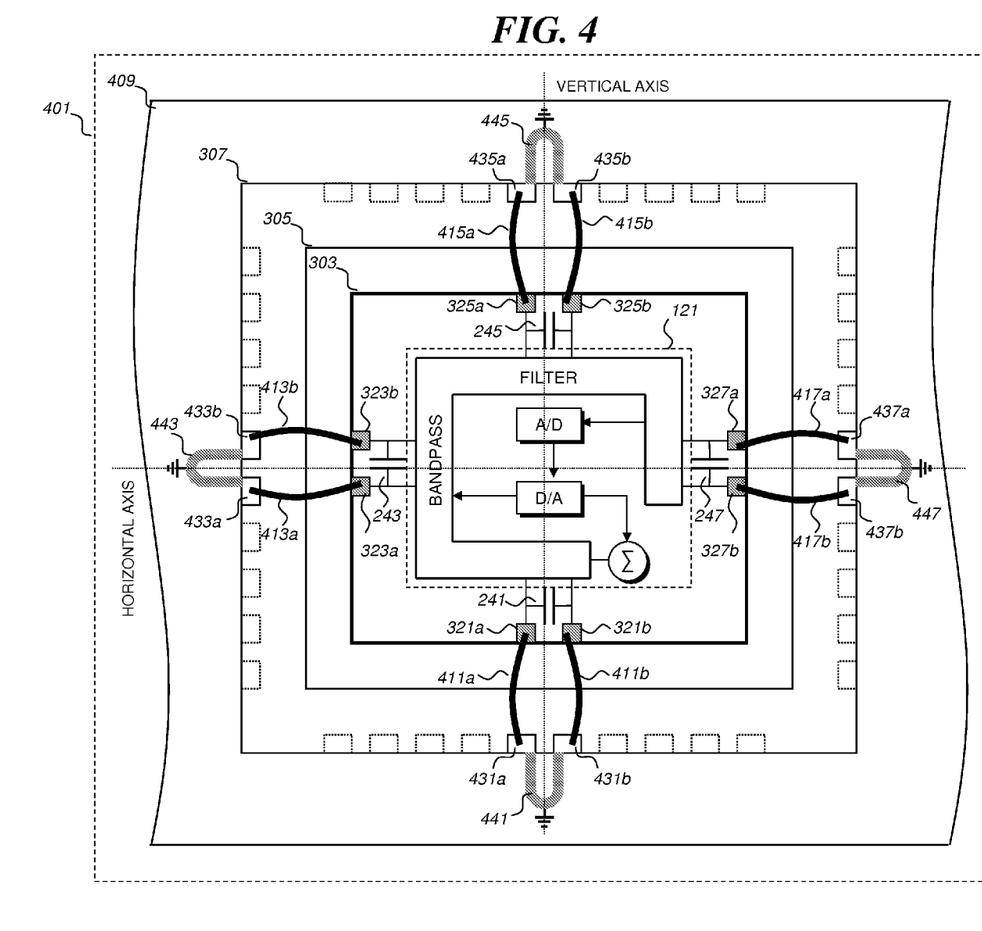
FIG. 4 is a top view of an integrated circuit package on a PCB board illustrating an alternative exemplary resonator scheme for a continuous-time bandpass delta-sigma modulator according to disclosed embodiments.

Referring now to FIG. 4, the top view of an integrated circuit assembly 401 illustrating an alternative exemplary resonator scheme for an eighth-order bandpass delta-sigma modulator in accordance with one or more embodiments will be discussed and described. The alternative embodiments provide an alternative approach to further extend the inductance value in the LC resonators while minimizing the magnetic coupling effect. The integrated circuit assembly 401 comprises a lead frame 307 of a quad flat package that is attached to a printed circuit board (PCB) 409. The lead frame 307 has a plurality of peripherally positioned pins, a die-attach paddle 305, and an integrated circuit die 303. The die-attach paddle 305 is positioned within a ring formed by the peripheral pins. The die 303 is attached to the center of the die-attach paddle 305 and comprises the bandpass delta-sigma core 121.

In this integrated circuit assembly 401, each differential inductor in formed by a pair of bond wires and a U-shaped planar conductive track positioned on the PCB board. The addition of the U-shaped conductive track allows increasing further the inductance. More specifically, the first inductor is formed by the bond wire pair (411a, 411b) and the U-shaped planar inductor 441. The bond wire 411a connects from the bond pad 321a to the lead frame pin 431a, and the bond wire 411b connects from the bond pad 321b to the lead frame pin 431b. The top ends of the U-shaped planar inductor 441 connect to pins 431a and 431b to complete the differential inductor. The rounded tip of the U-shaped planar inductor 441 is electrically connected to a constant potential. The second inductor is formed by the bond wire pair (415a, 415b) and the U-shaped planar inductor 445 via the bond pads 325a, 325b and the lead frame pins 435a and 435b. Similarly, the third inductor is formed by the bond wire pair (413a, 413b) and the U-shaped planar inductor 443 via the bond pads 323a, 323b and the lead frame pins 433a and 433b. Finally, the fourth inductor is formed by the bond wire pair (417a, 417b) and the U-shaped planar inductor 447 via the bond pads 327a, 327b and the lead frame pins 437a, and 437b.

The alignment of the first inductor (411a, 411b, 441) and the second inductor (415a, 415b, 445) on the vertical axis and the alignment of the third inductor (413a, 413b, 443) and the fourth inductor (417a, 417b, 447) on the horizontal axis reduce the magnetic field coupling effects among the four inductors as discussed in the previous exemplary embodiments. It is also understood that a fourth-order or sixth-order bandpass delta-sigma modulator can be configured with the above inductor positioning scheme using only two LC resonators, or three LC resonators respectively; and minimal magnetic couplings between inductors can still be achieved.

Figure 5:
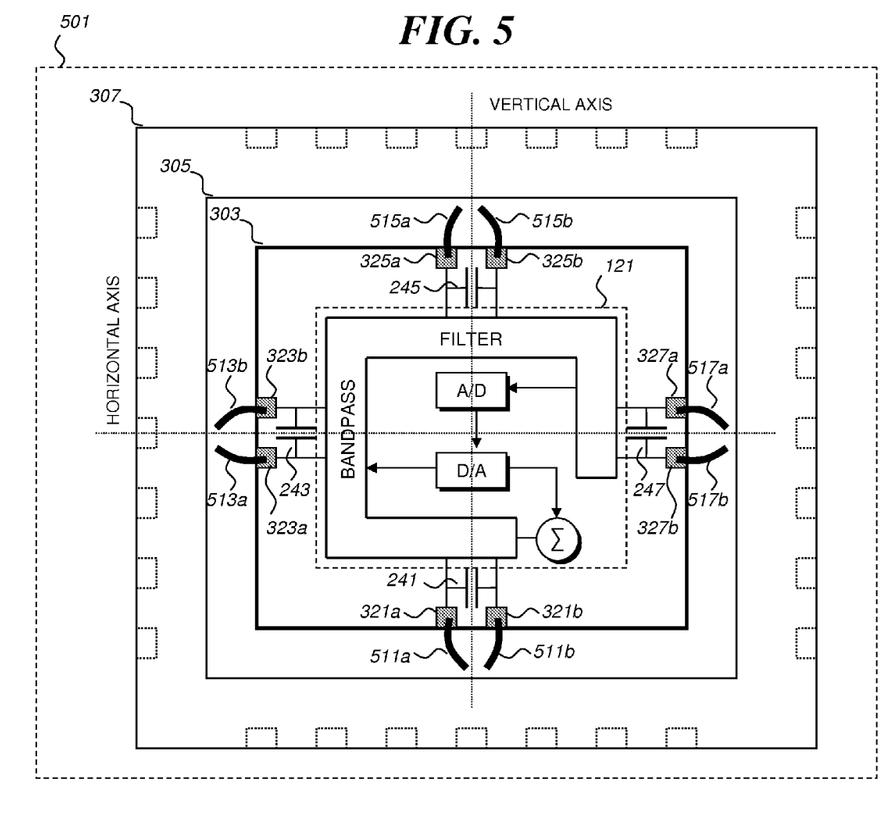
FIG. 5 is a top view of an integrated circuit package illustrating an alternative exemplary resonator scheme for a continuous-time bandpass delta-sigma modulator according to disclosed embodiments.

Referring now to FIG. 5, the top view of a quad flat package 501 illustrating an alternative exemplary resonator scheme for an eighth-order bandpass delta-sigma modulator in accordance with one or more embodiments will be discussed and described. An alternative approach is provided in the embodiments using bond wires as inductors and reducing lead frame pins. The quad flat package 501 comprises a lead frame 307 with a plurality of peripherally positioned pins, a die-attach paddle 305, and an integrated circuit die 303. The die-attach paddle 305 is positioned within a ring formed by the peripheral pins. The die 303 is attached to the center of the die-attach paddle 305 and comprises a bandpass delta-sigma core 121.

In this quad flat package 501, the first inductor is formed by the bond wire pair (511a, 511b) which connects to the die pads 321a and 321b, respectively, on one end, while the other ends of the bond wire pair are connected to the die-attach paddle 305. Likewise, the second inductor is formed by the bond wire pair (515a, 515b) which connects to the die pads 325a, 325b and to the die-attach paddle 305. The third inductor is formed by the bond wire pair (513a, 513b) which connects to the die pads 323a, 323b and to the die-attach paddle 305. The fourth inductor is formed by the bond wire pair (517a, 517b) which connects to the die pad 327a, 327b and to the die-attach paddle 305. In general, as the lead frame 307 is attached to the PCB board, the bottom of the die-attach paddle 305 is soldered and should be electrically connected to a PCB board ground. Therefore, the center taps of the four inductors (511a, 511b), (513a, 513b), (515a, 515b) and (517a, 517b) are all electrically connected to the PCB board ground, which is a constant potential. The bond wire pairs in this configuration are not connected to the lead frame 307; thereby saving at least four lead frame pins.

The alignment of the first inductor (511a, 511b) and the second inductor (515a, 515b) on the vertical axis and the alignment of the third inductor (513a, 513b) and the fourth inductor (517a, 517b) on the horizontal axis reduce the magnetic field coupling effects among the four inductors as discussed in the previous exemplary embodiments. It is also understood that a fourth-order or sixth-order bandpass delta-sigma modulator can be configured with the above inductor positioning scheme using only two LC resonators, or three LC resonators respectively.

It should be noted that the term communication unit may be used herein to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wide-band networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof.

Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An integrated circuit device for digitizing an RF signal comprising:
   an integrated circuit die having a rectangular shape;
   a plurality of LC resonators constituting a bandpass filter configured to receive the error signal and a first digital-to-analog signal to produce an amplified error signal;
   a summer receiving an RF signal and a second digital-to-analog signal to produce an error signal;
   a analog-to-digital converter configured to receive the amplified error signal to produce a quantized RF signal;
   a digital-to-analog converter configured to receive the quantized RF signal to generate a first digital-to-analog signal and a second digital-to-analog signal;
   wherein
      there are at least two LC resonators and at most four LC resonators;
      each LC resonator comprises a U-shaped inductor, constructed from a conductive metal layer on the integrated circuit die;
      a first and second U-shaped inductors are aligned along a horizontal axis centered approximately on the integrated circuit die, with the rounded tip of the first U-shaped inductor facing outward to the first edge of the integrated die, and the rounded tip of the second U-shaped inductor facing outward to the second edge of the integrated die, which is opposite to the first edge of the integrated die;
      the centers of the rounded tips of the first and second U-shaped inductors are electrically connected to a constant potential;
      a first capacitor is coupled across the gaps at the two ends of the first U-shaped inductor; and
      a second capacitors is coupled across the gaps at the two ends of the second U-shaped inductor.

2. The integrated circuit device of claim 1, wherein there are three LC resonators;
   a third U-shaped inductor is aligned along a vertical axis perpendicular to the horizontal axis and centered approximately on the integrated circuit die, with the rounded tip of the third U-shaped inductor facing outward to the third edge of the integrated die;
   the center of the rounded tip of the third U-shaped inductor is electrically connected to a constant potential; and
   a third capacitor is coupled across the gap at the two ends of the third U-shaped inductor.

3. The integrated circuit device of claim 1, wherein there are four LC resonators;
   a third and fourth U-shaped inductors are aligned along a vertical axis perpendicular to the horizontal axis and centered approximately on the integrated circuit die, with the rounded tip of the third U-shaped inductor facing outward to the third edge of the integrated die, and the rounded tip of the fourth U-shaped inductor facing outward to the fourth edge of the integrated die, which is opposite to the third edge of the integrated die;
   the centers of the rounded tips of the third and fourth U-shaped inductors are electrically connected to a constant potential;
   a third capacitor is coupled across the gaps at the two ends of the third U-shaped inductor; and
   a fourth capacitor is coupled across the gaps at the two ends of the fourth U-shaped inductor.

4. An integrated circuit device for digitizing an RF signal comprising:
   a lead frame comprising a plurality of peripherally positioned pins;
   a die-attach paddle positioned within a ring formed by the plurality of peripherally positioned pins;
   an integrated circuit die having a rectangular shape attached to the center of die-attach paddle;
   a plurality of LC resonators constituting a bandpass filter configured to receive the error signal and a first digital-to-analog signal to produce an amplified error signal;
   a summer receiving an input RF signal and a second digital-to-analog signal to produce an error signal;
   a analog-to-digital converter configured to receive the amplified error signal to produce a quantized RF signal;
   a digital-to-analog converter configured to receive the quantized RF signal to generate a first digital-to-analog signal and a second digital-to-analog signal;
   wherein
      there are at least two LC resonators and at most four LC resonators;
      the integrated die comprises a plurality of peripherally positioned pads;
      the inductor in each LC resonator is formed by two bond wires, with the first end of the first bond wire attached to a first pad on the integrated die, the first end of the second bond wire attached to a second pad on the integrated die adjacent to the first pad;
      a first and second bond-wire inductors are aligned along a horizontal axis centered approximately on the integrated circuit die, with the first and second pads of the first bond-wire inductor mirroring each other along the horizontal axis, and the first and second pads of the second bond-wire inductor mirroring each other along the horizontal axis;
      a first capacitor is coupled across the first and second pads connected to the first bond-wire inductor; and
      a second capacitor is coupled across the first and second pads connected to the second bond-wire inductor.

5. The integrated circuit device of claim 4, wherein there are three LC resonators;

a third bond-wire inductor is aligned along a vertical axis perpendicular to the horizontal axis and centered approximately on the integrated circuit die, with the first and second pads of the third bond-wire inductor mirroring each other along the vertical axis; and a third capacitor is coupled across the first and second pads connected to the third bond-wire inductor.

6. The integrated circuit device of claim 5, wherein
the second ends of the two bond wires forming the inductor of the third LC resonator are attached to a third common pin, which is approximately a center pin on the third side of the lead frame; and
the third common pin is electrically connected to a constant potential.

7. The integrated circuit device of claim 5, wherein
the second ends of the two bond wires forming the inductor of the third LC resonator are attached outward from the integrated circuit die to the die-attach paddle near the vertical axis.

8. The integrated circuit device of claim 4, wherein
there are four LC resonators;
a third and fourth bond-wire inductors are aligned along a vertical axis perpendicular to the horizontal axis and centered approximately on the integrated circuit die, with the first and second pads of the third bond-wire inductor mirroring each other along the vertical axis, and the first and second pads of the fourth bond-wire inductor mirroring each other along the vertical axis;
a third capacitor is coupled across the first and second pads connected to the third bond-wire inductor; and
a fourth capacitor is coupled across the first and second pads connected to the fourth bond-wire inductor.

9. The integrated circuit device of claim 8, wherein
the second ends of the two bond wires forming the inductor of the third LC resonator are attached to a third common pin, which is approximately a center pin on the third side of the lead frame;
the third common pin is electrically connected to a constant potential;
the second ends two bond wires forming the inductor of the fourth LC resonator are attached to a fourth common pin, which is approximately a center pin on the fourth side of the lead frame; and
the fourth common pin is electrically connected to a constant potential.

10. The integrated circuit device of claim 8, wherein
the second ends of the two bond wires forming the inductor of the third LC resonator are attached outward from the integrated circuit die to the die-attach paddle near the vertical axis; and
the second ends of the two bond wires forming the inductor of the fourth LC resonator are attached outward from the integrated circuit die to the die-attach paddle near the vertical axis.

11. The integrated circuit device of claim 4, wherein
the second ends of the two bond wires forming the inductor of the first LC resonator are attached to a first common pin, which is approximately a center pin on the first side of the lead frame;
the first common pin is electrically connected to a constant potential;
the second ends of the two bond wires forming the inductor of the second LC resonator are attached to a second common pin, which is approximately a center pin on the second side of the lead frame; and
the second common pin is electrically connected to a constant potential.

12. The integrated circuit device of claim 4, wherein
the second ends of the two bond wires forming the inductor of the first LC resonator are attached outward from the integrated circuit die to the die-attach paddle near the horizontal axis; and
the second ends of the two bond wires forming the inductor of the second LC resonator are attached outward from the integrated circuit die to the die-attach paddle near the horizontal axis.

13. An integrated circuit device digitizing an RF signal comprising:
a PCB board;
a lead frame comprising a plurality of peripherally positioned pins attached to the PCB board;
a die-attach paddle positioned within a ring formed by the plurality of peripherally positioned pins;
an integrated circuit die having a rectangular shape attached to the die-attach paddle;
a plurality of LC resonators constituting a bandpass filter configured to receive the error signal and a first digital-to-analog signal to produce an amplified error signal;
a summer receiving an input RF signal and a second digital-to-analog signal to produce an error signal;
an analog-to-digital converter configured to receive the amplified error signal to produce a quantized RF signal;
a digital-to-analog converter configured to receive the quantized RF signal to generate a first digital-to-analog signal and a second digital-to-analog signal;
wherein
there are at least two LC resonators and at most four LC resonators;
the integrated die comprises a plurality of peripherally positioned pads;
the inductor in each LC resonator is partially formed by a pair of bond wires, with the first end of the first bond wire attached to a first pad on the integrated die, the first end of the second bond wire attached to a second pad on the integrated die adjacent to the first pad;
a first and second pairs of bond wires, belonging to the first and second LC resonators, respectively, are aligned along a horizontal axis centered approximately on the integrated circuit die, with the first and second pads to the first pair of bond wires mirroring each other along the horizontal axis, and the first and second pads to the second pair of bond wires mirroring each other along the horizontal axis;
a first capacitor is coupled across the first and second pads connected to the first pair of bond wires; and
a second capacitor is coupled across the first and second pads connected to the second pair of bond wires.

14. The integrated circuit device of claim 13, wherein
there are three LC resonators;
a third pair of bond wires, belonging third LC resonator is aligned along a vertical axis perpendicular to the horizontal axis and centered approximately on the integrated circuit die, with the first and second pads to the third pair of bond wires mirroring each other along the vertical axis; and
a third capacitor is coupled across the first and second pads connected to the third pair of bond wires.

15. The integrated circuit device of claim 14, wherein
the second end of the first bond wire of the third LC resonator is attached to a fifth pin on the lead frame, and the second end of the second bond wire of the third LC resonator is attached to a sixth pin on the lead frame;

the fifth and sixth pins are adjacent to each other, and are approximately centered along the third side of the lead frame;

a third U-shaped conductive track on the PCB board having the two ends connected to the fifth and sixth pins on the lead frame with the third pair of bond wires forms the complete inductor of the third LC resonator; and the center of the rounded tip of the third U-shaped conductive track is electrically connected to a constant potential.

16. The integrated circuit device of claim 13, wherein the second end of the first bond wire of the first LC resonator is attached to a first pin on the lead frame, and the second end of the second bond wire of the first LC resonator is attached to a second pin on the lead frame;

the first and second pins are adjacent to each other, and are approximately centered along the first side of the lead frame;

a first U-shaped conductive track on the PCB board having the two ends connected to the first and second pins on the lead frame with the first pair of bond wires forms the complete inductor of the first LC resonator;

the center of the rounded tip of the first U-shaped conductive track is electrically connected to a constant potential;

the second end of the first bond wire of the second LC resonator is attached to a third pin on the lead frame, and the second end of the second bond wire of the second LC resonator is attached to a fourth pin on the lead frame;

the third and fourth pins are adjacent to each other, and are approximately centered along the second side of the lead frame;

a second U-shaped conductive track on the PCB board having the two ends connected to the third and fourth pins on the lead frame with the second pair of bond wires forms the complete inductor of the second LC resonator; and the center of the rounded tip of the second U-shaped conductive track is electrically connected to a constant potential.

17. The integrated circuit device of claim 13, wherein there are four LC resonators;

a third and fourth pairs of bond wires, belonging respectively to the third and fourth LC resonators, are aligned along a vertical axis perpendicular to the horizontal axis and centered approximately on the integrated circuit die, with the first and second pads to the third pair of bond wires mirroring each other along the vertical axis, and the first and second pads to the fourth pair of bond wires mirroring each other along the vertical axis;

a third capacitor is coupled across the first and second pads connected to the third pair of bond wires; and a fourth capacitor is coupled across the first and second pads connected to the fourth pair of bond wires.

18. The integrated circuit device of claim 17, wherein the second end of the first bond wire of the third LC resonator is attached to a fifth pin on the lead frame, and the second end of the second bond wire of the third LC resonator is attached to a sixth pin on the lead frame;

the fifth and sixth pins are adjacent to each other, and are approximately centered along the third side of the lead frame;

a third U-shaped conductive track on the PCB board having the two ends connected to the fifth and sixth pins on the lead frame with the third pair of bond wires forms the complete inductor of the third LC resonator;

the center of the rounded tip of the third U-shaped conductive track is electrically connected to a constant potential;

the second end of the first bond wire of the fourth LC resonator is attached to a seventh pin on the lead frame, and the second end of the second bond wire of the fourth LC resonator is attached to a eighth pin on the lead frame;

the seventh and eighth pins are adjacent to each other, and are approximately centered along the fourth side of the lead frame;

a fourth U-shaped conductive track on the PCB board having the two ends connected to the seventh and eighth pins on the lead frame with the fourth pair of bond wires forms the complete inductor of the fourth LC resonator; and the center of the rounded tip of the fourth U-shaped conductive track is electrically connected to a constant potential.

\* \* \* \* \*